United States Patent
Chen et al.

(10) Patent No.: US 11,075,328 B2
(45) Date of Patent: Jul. 27, 2021

(54) METHOD OF FORMING CONDUCTIVE AREA AT TOP SURFACE OF LIGHT-EMITTING DIODE

(71) Applicant: MIKRO MESA TECHNOLOGY CO., LTD., Apia (WS)

(72) Inventors: Li-Yi Chen, Tainan (TW); Yi-Ching Lin, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 43 days.

(21) Appl. No.: 16/432,918

(22) Filed: Jun. 5, 2019

(65) Prior Publication Data

US 2020/0388733 A1 Dec. 10, 2020

(51) Int. Cl.
*H01L 33/62* (2010.01)
*H01L 33/56* (2010.01)
*H01L 33/42* (2010.01)
*H01L 33/58* (2010.01)

(52) U.S. Cl.
CPC .............. *H01L 33/62* (2013.01); *H01L 33/42* (2013.01); *H01L 33/56* (2013.01); *H01L 33/58* (2013.01); *H01L 2933/005* (2013.01); *H01L 2933/0016* (2013.01); *H01L 2933/0058* (2013.01); *H01L 2933/0066* (2013.01)

(58) Field of Classification Search
CPC ...................................................... H01L 33/62
See application file for complete search history.

(56) References Cited

U.S. PATENT DOCUMENTS

| 2016/0240732 A1* | 8/2016 | Huang | H01L 33/62 |
| 2018/0182746 A1* | 6/2018 | Bibl | H01L 33/08 |
| 2018/0277528 A1* | 9/2018 | Hasegawa | H01L 33/58 |

FOREIGN PATENT DOCUMENTS

TW 201635584 A 10/2016

* cited by examiner

*Primary Examiner* — Walter H Swanson
(74) *Attorney, Agent, or Firm* — CKC & Partners Co., LLC

(57) ABSTRACT

A method of forming a conductive area at a top surface of a light-emitting diode includes: preparing a substrate having a top surface with a conductive pad thereon; bonding a light-emitting diode having first and second type semiconductor layers and an active layer to the conductive pad; forming a polymer layer on the substrate such that a difference between a distance from a first surface of the polymer layer to the top surface of the substrate and a distance from a second surface of the polymer layer to a top surface of the light-emitting diode is greater than a distance from an interface between a second type semiconductor layer and an active layer to the top surface of the substrate; and etching the polymer layer till the second type semiconductor layer to expose the top surface of the light-emitting diode from the polymer layer.

12 Claims, 6 Drawing Sheets

METHOD OF FORMING CONDUCTIVE AREA AT TOP SURFACE OF LIGHT-EMITTING DIODE

BACKGROUND

Field of Invention

The present disclosure relates to a method of forming a conductive area for a light-emitting diode.

Description of Related Art

The statements in this section merely provide background information related to the present disclosure and do not necessarily constitute prior art.

Traditional display manufacturing is a standardized process set. In recent years, there are more and more new types of displays such as a micro light-emitting diode display, a mini light-emitting diode display, and a quantum dot light-emitting diode display . . . etc., which are promising to dominate the future display market, and thus new display manufacturing processes are waiting to be set up. There are many steps contained in a manufacturing process set in order to produce one display, and reducing one of the steps thereof can reduce the cost and enhance the efficiency.

SUMMARY

According to some embodiments of the present disclosure, a method of forming a conductive area at a top surface of a light-emitting diode is provided. The method includes: preparing a substrate having a top surface with a conductive pad thereon; bonding a light-emitting diode to the conductive pad, the light-emitting diode including a bottom electrode, a first type semiconductor layer on the bottom electrode, an active layer on the first type semiconductor layer, and a second type semiconductor layer on the active layer, in which the bottom electrode is in contact with the conductive pad when the light-emitting diode is bonded to the conductive pad; forming a polymer layer on the substrate to cover the top surface of the substrate, the conductive pad, and the light-emitting diode such that a difference between a distance from a first surface of the polymer layer to the top surface of the substrate and a distance from a second surface of the polymer layer to a top surface of the light-emitting diode is greater than a distance from an interface between the second type semiconductor layer and the active layer to the top surface of the substrate, in which a vertical projection of the first surface projected on the substrate is spaced apart from a vertical projection of the light-emitting diode projected on the substrate, and a vertical projection of the second surface projected on the substrate is overlapped with the vertical projection of the light-emitting diode projected on the substrate; and etching the polymer layer till the second type semiconductor layer to expose the top surface of the light-emitting diode from the polymer layer.

According to some embodiments of the present disclosure, a method of forming a conductive area at a top surface of a light-emitting diode is provided. The method includes: preparing a substrate having a top surface with a conductive pad thereon; bonding a light-emitting diode to the conductive pad, the light-emitting diode including a bottom electrode, a first type semiconductor layer on the bottom electrode, an active layer on the first type semiconductor layer, and a second type semiconductor layer on the active layer, in which the bottom electrode is in contact with the conductive pad when the light-emitting diode is bonded to the conductive pad; forming a polymer layer on the substrate to cover the top surface of the substrate, the conductive pad, and the light-emitting diode, in which a vertical projection of a first surface projected on the substrate is spaced apart from a vertical projection of the light-emitting diode projected on the substrate, and a vertical projection of a second surface projected on the substrate is overlapped with the vertical projection of the light-emitting diode projected on the substrate; and etching the polymer layer till the second type semiconductor layer to expose the top surface of the light-emitting diode from the polymer layer, in which the first type semiconductor layer and the active layer are free from exposing by the polymer layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
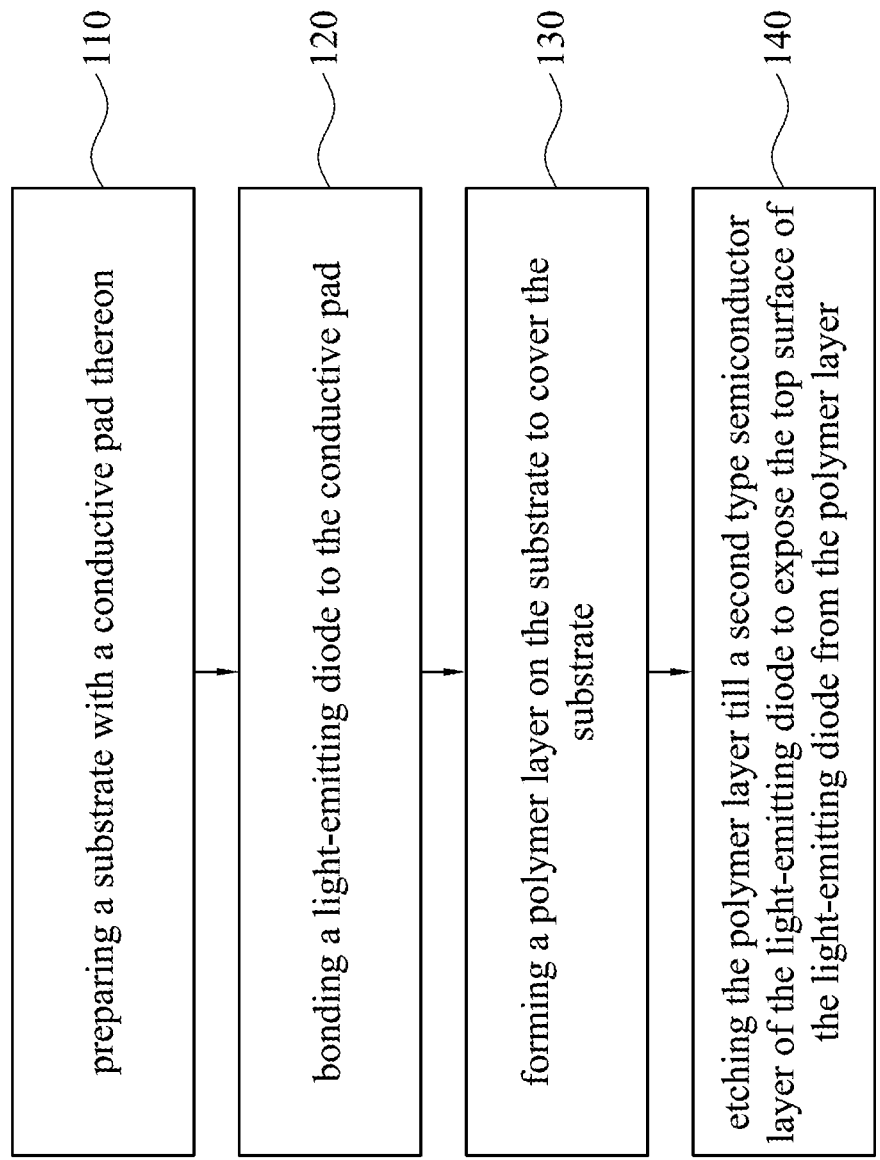
FIG. 1 is a flow chart of a method of forming a conductive area at a top surface of a light-emitting diode according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

FIG. 1 is a flow chart of a method 100 of forming a conductive area at a top surface of a light-emitting diode according to some embodiments of the present disclosure. FIGS. 2A to 2E are schematic cross-sectional views of intermediate stages of the method 100 of FIG. 1 according to some embodiments of the present disclosure.

Figure 2A:
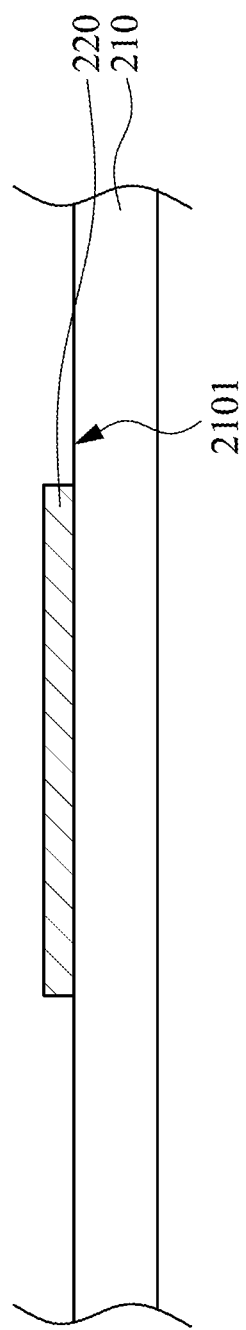
FIG. 2A is a schematic cross-sectional view of an intermediate stage of a method of forming a conductive area at a top surface of a light-emitting diode according to some embodiments of the present disclosure.
Figure 2B:
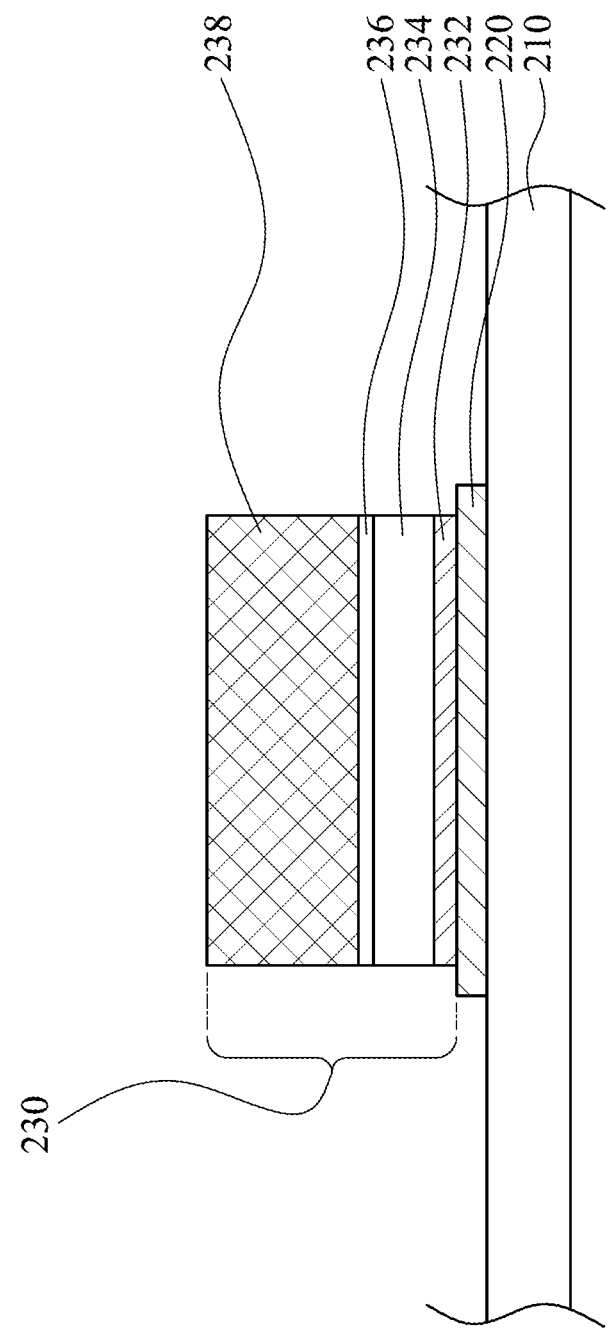
FIG. 2B is a schematic cross-sectional view of an intermediate stage of a method of forming a conductive area at a top surface of a light-emitting diode according to some embodiments of the present disclosure.
Figure 2C:
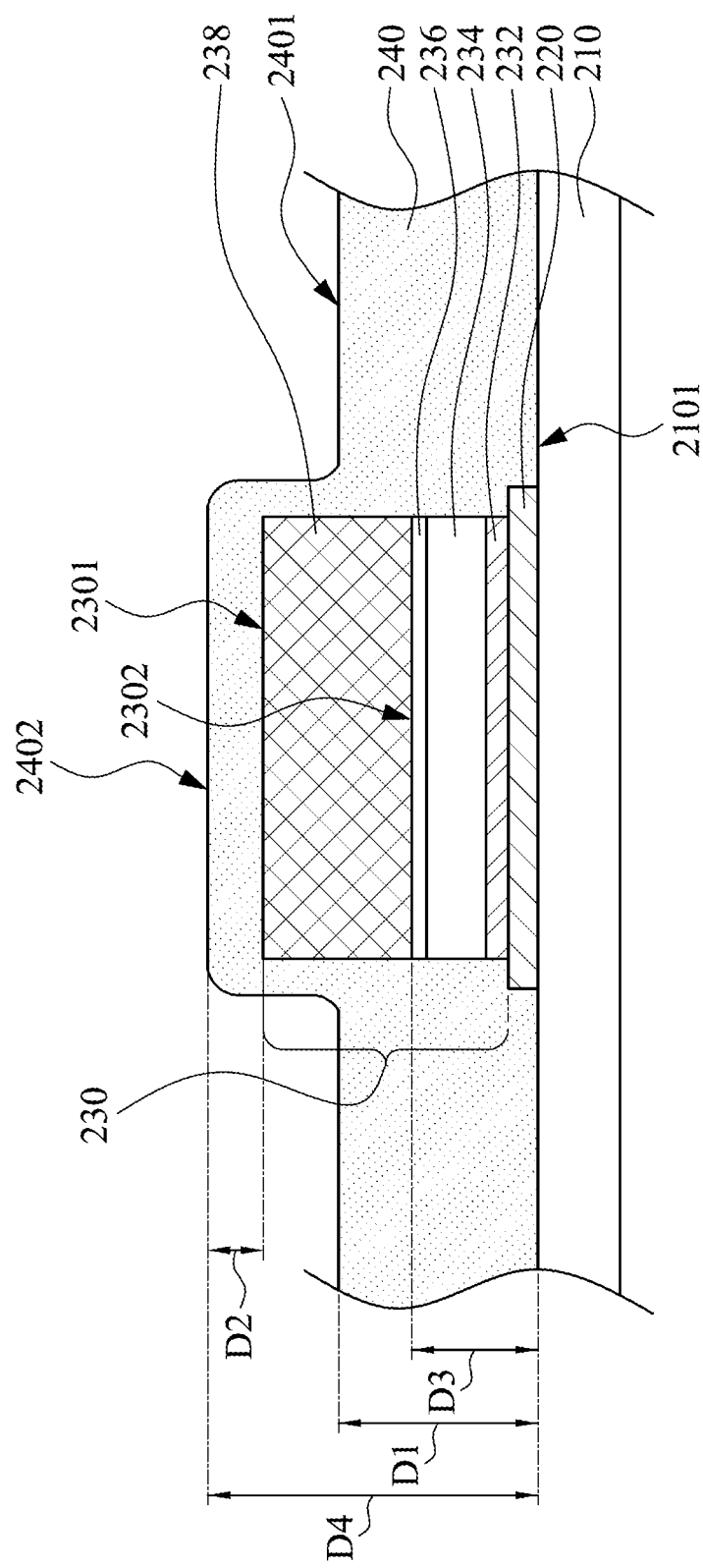
FIG. 2C is a schematic cross-sectional view of an intermediate stage of a method of forming a conductive area at a top surface of a light-emitting diode according to some embodiments of the present disclosure.
Figure 2D:
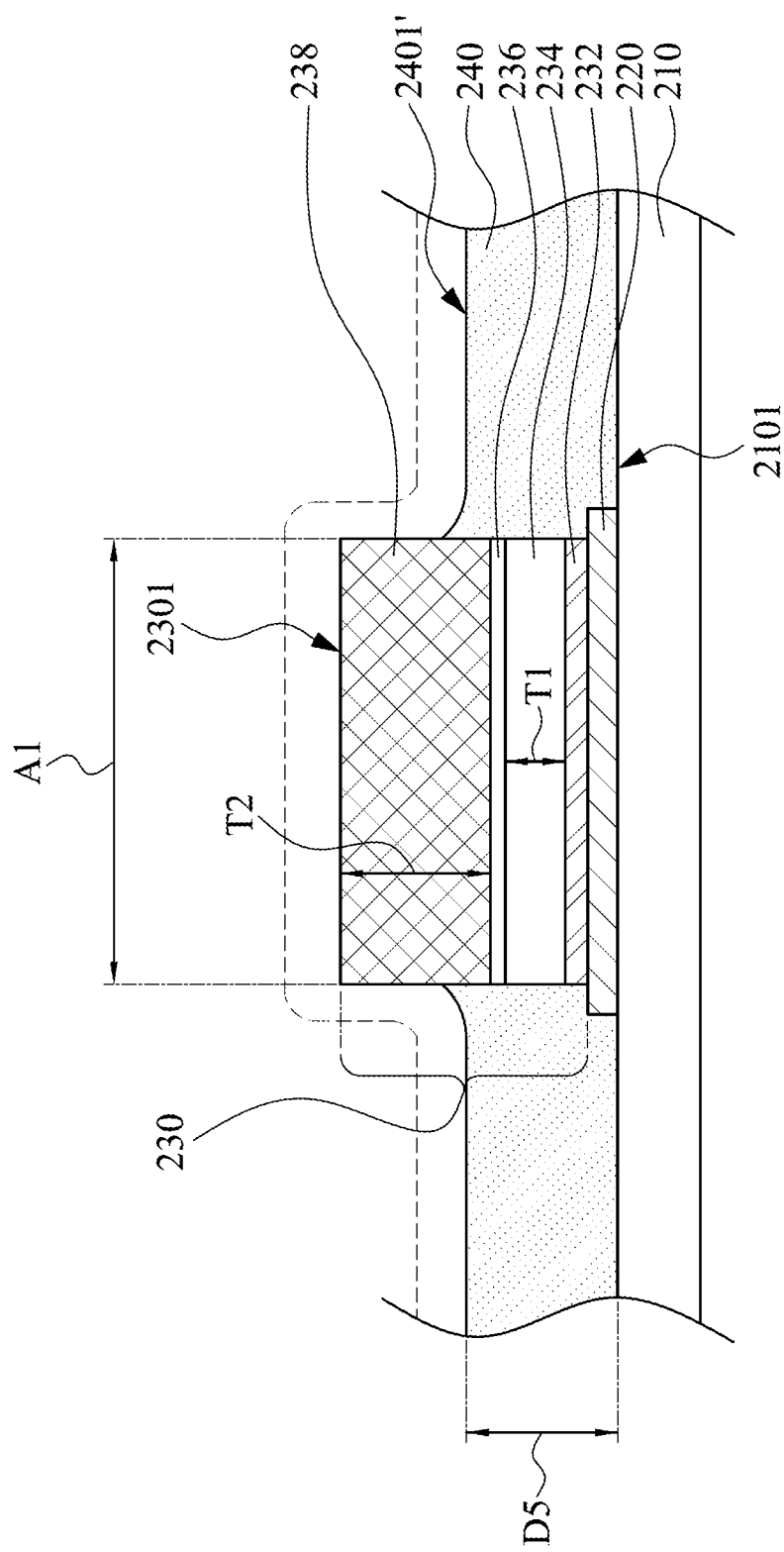
FIG. 2D is a schematic cross-sectional view of an intermediate stage of a method of forming a conductive area at a top surface of a light-emitting diode according to some embodiments of the present disclosure.
Figure 2E:
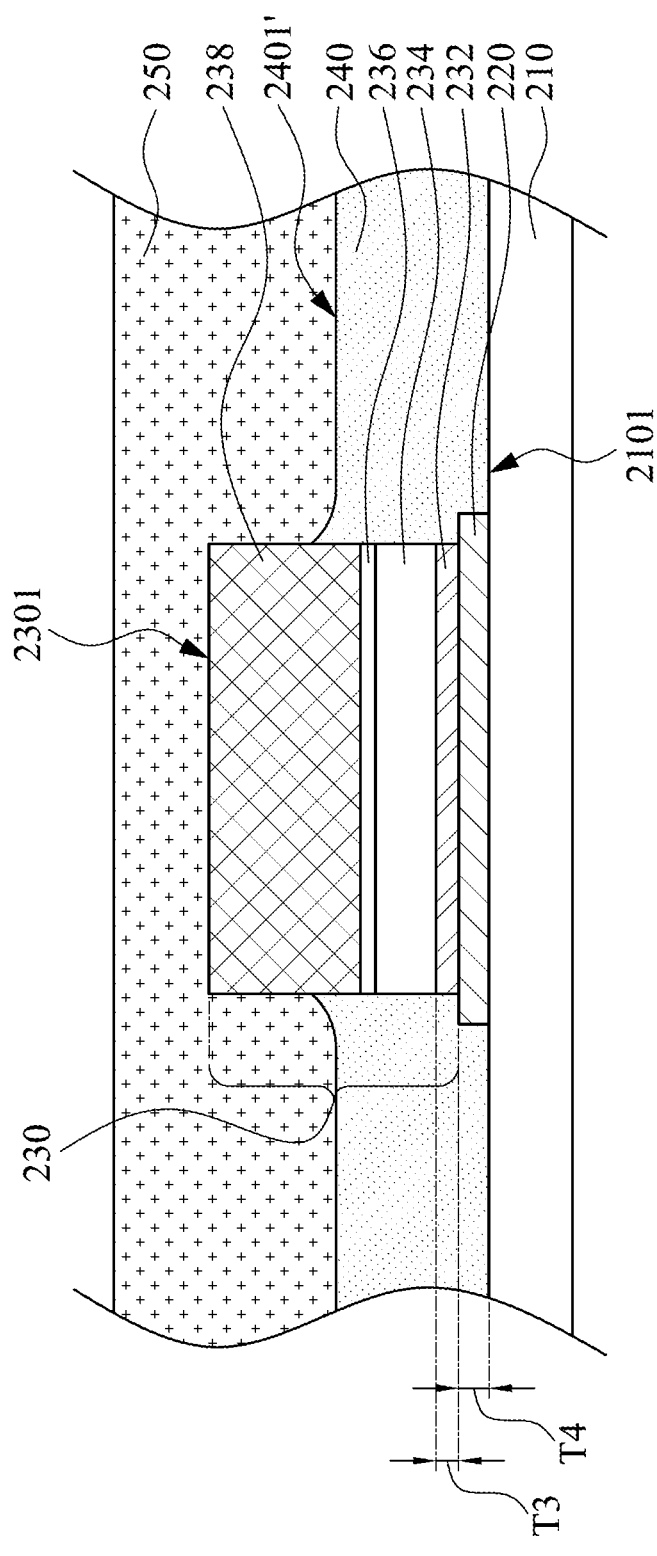
FIG. 2E is a schematic cross-sectional view of an intermediate stage of a method of forming a conductive area at a top surface of a light-emitting diode according to some embodiments of the present disclosure.

Reference is made to FIGS. 1 to 2E. The method 100 of forming a conductive area A1 at a top surface 2301 of a light-emitting diode 230 begins with operation 110 in which a substrate 210 with a conductive pad 220 thereon is prepared (as referred to FIG. 2A). The method continues with operation 120 in which a light-emitting diode 230 is bonded to the conductive pad 220 (as referred to FIG. 2B). The method 100 continues with operation 130 in which a polymer layer 240 is formed on the substrate 210 to cover a top surface 2101 of the substrate 210, the conductive pad 220, and the light-emitting diode 230 (as referred to FIG. 2C). The method 100 continues with operation 140 in which the polymer layer 240 is etched till a second type semiconductor layer 238 of the light-emitting diode 230 to expose the top surface 2301 of the light-emitting diode 230 from the polymer layer 240 (as referred to FIG. 2D).

Although in the previous paragraph only "a" light-emitting diode 230 is mentioned, "multiple" light-emitting diode 230 may be used in practical applications and is still within the scope of the present disclosure, and will not be emphasized in the disclosure. The light-emitting diode 230 demonstrated herein is a vertical type light-emitting diode.

Reference is made to FIG. 2B. The light-emitting diode 230 includes a bottom electrode 232, a first type semiconductor layer 234, an active layer 236, and the second type semiconductor layer 238. In some embodiments, the first type semiconductor layer 234 is on the bottom electrode 232. The active layer 236 is on the first type semiconductor layer 234. The second type semiconductor layer 238 is on the active layer 236. The bottom electrode 232 is in contact with the conductive pad 220 of the substrate 210 when the light-emitting diode 230 is bonded to the conductive pad 220.

Reference is made to FIG. 2C. After the polymer layer 240 is formed on the substrate 210 and the light-emitting diode 230, a difference between a distance D1 from a first surface 2401 of the polymer layer 240 to the top surface 2101 of the substrate 210 and a distance D2 from a second surface 2402 of the polymer layer 240 to a top surface 2301 of the light-emitting diode 230 is greater than a distance D3 from an interface 2302 between the second type semiconductor layer 238 and the active layer 236 to the top surface 2101 of the substrate 210. Briefly speaking, D1−D2>D3. Specifically, a vertical projection of the first surface 2401 projected on the substrate 210 is spaced apart from a vertical projection of the light-emitting diode 230 projected on the substrate 210, and a vertical projection of the second surface 2402 projected on the substrate 210 is overlapped with the vertical projection of the light-emitting diode 230 projected on the substrate 210. In some embodiments, a distance D4 from the second surface 2402 of the polymer layer 240 to the top surface 2101 of the substrate 210 is greater than the distance D1 from the first surface 2401 of the polymer layer 240 to the top surface 2101 of the substrate 210.

Reference is made to FIG. 2D. Due to the above condition: D1−D2>D3, the polymer layer 240 can be etched till the second type semiconductor layer 238 to expose the top surface 2301 of the light-emitting diode 230 from the polymer layer 240 without using any other materials for covering the polymer layer 240 as a mask. Specifically, a step of forming a mask layer to open a window on the polymer layer 240 for etching can be omitted so as to reduce the cost and enhance the manufacturing efficiency. The etching can be performed by ashing, plasma etching (e.g., inductive coupled plasma (ICP) etching or reactive ion etching (RIE)), but should not be limited thereto. Normally, an etching rate on the first surface 2401 of the polymer layer 240 is roughly the same as an etching rate on the second surface 2402 of the polymer layer 240. As a result, after a time period of etching, the first surface 2401 is lowered down to a new first surface 2401' as shown in FIG. 2D. The second surface 2402 is lowered down until it vanishes to expose the top surface 2301 of the light-emitting diode 230. It is noted that the first type semiconductor layer 234 and the active layer 236 are free from exposing by the polymer layer 240 after the etching. That is, after the etching, the first type semiconductor layer 234 and the active layer 236 are still covered by the polymer layer 240 (at least on side surfaces thereof) to ensure there is an electrical isolation between the second type semiconductor layer 238 and the first type semiconductor layer 234 after a top electrode 250 (see FIG. 2E) is formed on the second type semiconductor layer 238.

In some embodiments when the polymer layer 240 is a positive photoresist layer, the etching can be performed by a partial exposure process followed by a development process. Specifically, the polymer layer 240 is exposed (e.g., by UV light, but should not be limited thereto) under weak exposure dose such that the photo-sensitive materials between the second surface 2402 and the top surface 2301 of the light-emitting diode 230 are all degraded, but the photo-sensitive materials between the first surface 2401 and the top surface 2101 of the substrate 210 are only partially degraded (i.e., only a portion of the photo-sensitive materials close to the first surface 2401 are degraded) due to a thickness difference between the thickness D2 (thinner) and the thickness D1 (thicker). As a result, when the development process is performed to dissolved the exposed photo-sensitive materials, the top surface 2301 of the light-emitting diode 230 is exposed while the top surface 2101 of the substrate 210 is still covered by the photoresist layer.

In some embodiments, a ratio between a thickness T2 of the second type semiconductor layer 238 and a thickness T1 of the first type semiconductor layer 234 is greater than or equal to about 1.5. The thickness relationship between the second type semiconductor layer 238 and the first type semiconductor layer 234 can increase the tolerance of the criterion: D1−D2>D3 as mentioned since a thicker layer (e.g., the second type semiconductor layer 238 in the embodiments herein) faces etching gases in a direction from the light-emitting diode 230 to the second surface 2402

(before etching) of the polymer layer 240. In some embodiments, a thickness D5 of the polymer layer 240 after etching is greater than or equal to about 2 µm, so as to better maintain the electrical isolation between the first type semiconductor layer 234 and the second type semiconductor layer 238 because the largest possible distance D3 is roughly or smaller than about 2 µm. In some embodiments, the first type semiconductor layer 234 is a p-type semiconductor layer, and the second type semiconductor layer 238 is an n-type semiconductor layer. Under this condition, the thicker layer is the n-type semiconductor layer which has lower resistivity compared to the p-type semiconductor layer, which leads to better light-emitting efficiency because the p-type semiconductor layer which has higher resistivity and contact resistance is already fully in contact with the bottom electrode 232 before the light-emitting diode 230 is bonded to the conductive pad 220. In some embodiments, a thickness of the p-type semiconductor layer is about 250 nm and a thickness of the active layer 236 is about 150 nm. In some embodiments, the light-emitting diode 230 further includes an electron blocking layer between the active layer 236 and the p-type semiconductor layer 234 so as to prevent electrons (which flow from the n-type semiconductor layer towards the active layer 236) from flowing out of the active layer 236 (and into the p-type semiconductor layer) and thus the light-emitting efficiency is enhanced.

Reference is made to FIG. 2E. In some embodiments, the method 100 further includes forming the top electrode 250 on the second type semiconductor layer 238 of the light-emitting diode 230 such that the top electrode 250 is in contact with the top surface 2301 of the light-emitting diode 230. Since the polymer layer 240 still covers the active layer 236 and the first type semiconductor layer 234 of the light-emitting diode 230, and the second type semiconductor layer 238 is exposed, the top electrode 250 can be directly formed on the second type semiconductor layer 238 without using any mask layer which is originally used for maintaining the electrical isolation between the second type semiconductor layer 238 and the first type semiconductor layer 234. As a result, the cost is reduced and the manufacturing efficiency is enhanced. Besides, the embodiments of the present disclosure can maintain the electrical isolation between the top electrode 250 and the conductive pad 220 on a site which is absent of light-emitting diode 230 on the conducive pad 220. This kind of unexpected absence sometimes occur due to defects when the light-emitting diodes 230 are massively transferred to the substrate 210. Since the thickness of the polymer layer 240 above the conductive pad 220 becomes thicker (e.g., having the thickness D1) when there is no light-emitting diode 230 thereon, the polymer layer 240 prevents the conductive pad 220 from being exposed during the etching and thus maintaining the electrical isolation as mentioned.

In some embodiments, the top electrode 250 is transparent so that light emitted from the light-emitting diode 230 can transmit through the top electrode 250 to enhance light extraction efficiency. The polymer layer 240 can be poly (methyl methacrylate) (PMMA), epoxy, polycarbonate (PC), polyethylene terephthalate (PET), polydimethylsiloxane (PDMS), polystyrene (PS), phenol-formaldehyde resin (phenolic resin), or polyimide (PI), but should not be limited thereto. In some embodiments, the polymer layer 240 is formed by spin coating or slit coating so as to form the thickness relationship as shown above in one coating step. In some embodiments, the polymer layer 240 includes titanium oxide ($TiO_2$) nanoparticles to increase a refractive index of the polymer layer 240 to further enhance the light extraction efficiency.

In some embodiments, the light-emitting diode 230 is a micro light-emitting diode having a lateral length less than or equal to about 100 µm. It is further noted that a preferable condition for a sum of a thickness T3 of the bottom electrode 232 and a thickness T4 of the conductive pad 220 is smaller than or equal to about 2 µm. The 2 µm is a balance of size (i.e., the lateral length≤about 100 µm) of the micro light-emitting diode and a capability to have an interstitial diffusion between the bottom electrode 232 and the conductive pad 220 when the micro light-emitting diode is bonded to the conductive pad 220. As a result, no melting process is performed during the bonding, and the micro light-emitting diode is better protected from damaging during bonding and a position of the micro light-emitting diode 230 relative to the conductive pad 220 can be better controlled.

In summary, a method of forming a conductive area at a top surface of a light-emitting diode is provided which is able to omit at least a mask layer forming process. As such, the cost is reduced and the manufacturing efficiency is increased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a conductive area at a top surface of a light-emitting diode, comprising:
    preparing a substrate having a top surface with a conductive pad thereon;
    bonding a light-emitting diode to the conductive pad, the light-emitting diode comprising a bottom electrode, a first type semiconductor layer on the bottom electrode, an active layer on the first type semiconductor layer, and a second type semiconductor layer on the active layer, wherein the bottom electrode is in contact with the conductive pad when the light-emitting diode is bonded to the conductive pad;
    forming a polymer layer on the substrate to cover the top surface of the substrate, the conductive pad, and the light-emitting diode such that a difference between a distance from a first surface of the polymer layer to the top surface of the substrate and a distance from a second surface of the polymer layer to a top surface of the light-emitting diode is greater than a distance from an interface between the second type semiconductor layer and the active layer to the top surface of the substrate, wherein a vertical projection of the first surface projected on the substrate is spaced apart from a vertical projection of the light-emitting diode projected on the substrate, and a vertical projection of the second surface projected on the substrate is overlapped with the vertical projection of the light-emitting diode projected on the substrate; and
    etching the polymer layer till the second type semiconductor layer to expose the top surface of the light-emitting diode from the polymer layer.

2. The method of claim 1, further comprising:
  forming a top electrode on the second type semiconductor layer of the light-emitting diode such that the top electrode is in contact with the top surface of the light-emitting diode.

3. The method of claim 2, wherein the top electrode is transparent.

4. The method of claim 1, wherein a ratio between a thickness of the second type semiconductor layer and a thickness of the first type semiconductor layer is equal to about 1.5.

5. The method of claim 4, wherein the first type semiconductor layer is a p-type semiconductor layer, and the second type semiconductor layer is an n-type semiconductor layer.

6. The method of claim 1, wherein a distance from the second surface of the polymer layer to the top surface of the substrate is greater than a distance from the first surface of the polymer layer to the top surface of the substrate.

7. The method of claim 1, wherein the polymer layer comprises titanium oxide ($TiO_2$) nanoparticles.

8. The method of claim 1, wherein a sum of a thickness of the bottom electrode and a thickness of the conductive pad is equal to about 2 μm.

9. The method of claim 1, wherein the polymer layer is formed by spin coating or slit coating.

10. The method of claim 1, wherein a thickness of the polymer layer after said etching is equal to about 2 μm.

11. The method of claim 1, wherein etching the polymer layer is performed by ashing or plasma etching.

12. The method of claim 1, wherein the polymer layer is a positive photoresist layer, and etching the polymer layer comprises:
  partially exposing the polymer layer; and
  developing the polymer layer.

* * * * *